(12) United States Patent
Egglestone et al.

(10) Patent No.: US 9,040,899 B2
(45) Date of Patent: *May 26, 2015

(54) TOOL SETTING OR ANALYSIS DEVICE WITH BACKUP OR REPEATED TRIGGER SIGNAL FOR DETECTING A ROTATING TOOL

(71) Applicant: RENISHAW PLC, Gloucestershire (GB)

(72) Inventors: Edward Benjamin Egglestone, Hartlepool (GB); Derek Marshall, Bristol (GB); Benjamin Jason Merrifield, Bristol (GB)

(73) Assignee: RENISHAW PLC, Wotton-Under-Edge (GB)

( * ) Notice: Subject to any disclaimer, the term of this patent is extended or adjusted under 35 U.S.C. 154(b) by 0 days.

This patent is subject to a terminal disclaimer.

(21) Appl. No.: 13/960,347

(22) Filed: Aug. 6, 2013

(65) Prior Publication Data

US 2013/0320200 A1 Dec. 5, 2013

Related U.S. Application Data

(63) Continuation of application No. 12/450,899, filed as application No. PCT/GB2008/001541 on May 2, 2008, now Pat. No. 8,530,823.

(30) Foreign Application Priority Data

May 2, 2007 (GB) .................................. 0708499.9

(51) Int. Cl.
*H01J 40/14* (2006.01)
*B23Q 17/24* (2006.01)
*H03K 17/94* (2006.01)

(52) U.S. Cl.
CPC ............ *B23Q 17/2485* (2013.01); *B23Q 17/24* (2013.01); *H03K 17/941* (2013.01); *H03K 2217/94104* (2013.01)

(58) Field of Classification Search
CPC ............. G01V 8/12; G01V 8/20; G01V 8/10; F16P 3/14; F16P 3/144; G01S 17/026; G01B 11/2433; G01B 11/105; G01B 11/10; G01B 11/02; G01B 11/24; G01B 11/2425; H03K 17/941; H03K 2217/94104; G01D 5/34; B23Q 17/24; B23Q 17/2485
USPC ......... 250/221, 222.1, 559.14, 559.12, 559.4, 250/559.24, 214.1, 214 R, 551; 340/680, 340/679, 555, 556, 600; 72/1–4, 14.3, 21.1, 72/21.3, 20.1, 441, 443; 100/348; 356/621, 638, 496; 408/6, 11, 16; 409/218, 134; 36/170, 173, 174, 175, 36/176, 177; 192/116.5, 125 R, 169–128, 192/125 A–125 F, 130, 131 R, 131 H, 192/132–137, 129 A, 129 B, 138–141, 192/142 R, 142 A, 143–150
See application file for complete search history.

(56) References Cited

U.S. PATENT DOCUMENTS 3,636,936 A   1/1972  Schuette et al.
4,347,438 A * 8/1982  Spielman ...................... 250/221
(Continued)

FOREIGN PATENT DOCUMENTS

CN   1729080 A   2/2006
CN   2912907 Y   6/2007
(Continued)

OTHER PUBLICATIONS

Non-Contact Tool Breakage Detector for NC Machines Installation Manual, 2011, Marposs S.p.A.
(Continued)

*Primary Examiner* — Que T Le
*Assistant Examiner* — Jennifer Bennett
(74) *Attorney, Agent, or Firm* — Oliff PLC

(57) ABSTRACT

A tool setting or tool analysis device for a machine tool includes a light source for producing a light beam. A light receiver receives the light beam and produces a signal indicative of the amount of light received. This is analyzed by a main analysis circuit to generate a trigger signal to a machine controller when the beam is at least partially occluded. To provide fail-safe operation should the main circuit not recognize the tool, a back-up trigger signal is produced after a delay by a delay circuit. In one preferred form, the back-up trigger signal may oscillate, providing repeated edges which can ensure fail-safe operation even if the machine controller suffers from a blind window and therefore misses the initial trigger signal.

25 Claims, 2 Drawing Sheets

(56) References Cited

U.S. PATENT DOCUMENTS

| | | |
|---|---|---|
| 4,434,363 A | 2/1984 | Yorifuji et al. |
| 4,692,750 A | 9/1987 | Murakami et al. |
| 5,005,978 A | 4/1991 | Skunes et al. |
| 5,218,196 A | 6/1993 | Dogul et al. |
| 5,293,048 A | 3/1994 | Skunes et al. |
| 5,750,896 A * | 5/1998 | Morgan et al. ............ 73/622 |
| 5,828,320 A | 10/1998 | Buck |
| 5,940,787 A | 8/1999 | Gelston |
| 6,805,357 B2 | 10/2004 | Dahlheimer |
| 7,071,452 B2 | 7/2006 | Warner et al. |
| 7,315,018 B2 | 1/2008 | Ashton et al. |
| 8,530,823 B2 * | 9/2013 | Egglestone et al. ....... 250/221 |
| 2002/0180278 A1 | 12/2002 | Veil et al. |
| 2005/0167619 A1 | 8/2005 | Stimpson et al. |

FOREIGN PATENT DOCUMENTS

| | | |
|---|---|---|
| CN | 201026577 Y | 2/2008 |
| DE | 101 55 583 A1 | 5/2003 |
| EP | 1 010 045 B1 | 1/2002 |
| WO | WO 01/38822 A1 | 5/2001 |
| WO | WO 2004/056528 A1 | 7/2004 |

OTHER PUBLICATIONS

"Repetition Code," *Wikipedia*, obtained on Jan. 6, 2014.

"Redundancy (engineering)," *Wikipedia*, obtained on Jan. 6, 2014.

Writ of Summons, Court of Milan, dated Dec. 23, 2013 (w/ translation).

Taiwanese Office Action issued in Taiwanese Patent Application No. 097116391 dated Jan. 9, 2014 (w/ translation).

Jan. 4, 2015 Office Action issued in Chinese Patent Application No. 201310138496.4.

* cited by examiner

TOOL SETTING OR ANALYSIS DEVICE WITH BACKUP OR REPEATED TRIGGER SIGNAL FOR DETECTING A ROTATING TOOL

This is a Continuation of application Ser. No. 12/450,899 filed Oct. 16, 2009, which is a National Phase Application of PCT/GB2008/001541. The disclosure of the prior application is hereby incorporated by reference herein in its entirety.

BACKGROUND

This invention relates to devices for analysing a tool, particularly a cutting tool for use with a machine tool. It may be used, for example, for determination of the position of the cutting tool, as in tool setting, or to determine its condition, e.g. whether it is broken or worn.

International Patent Application No. WO 2004/056528 describes such a tool setting device, using a so-called "break beam" system. A light beam passes between a light transmitter and receiver. A toothed cutting tool is rotated as it enters this beam. A complex signal from the receiver is digitised in an analogue-to-digital converter, to produce a numerical representation of the receiver signal. This is then processed digitally in a digital signal processor (DSP), or in a field-programmable gate array, an application specific integrated circuit or a general-purpose microprocessor e.g. a programmable integrated circuit (PIC) or a personal computer system, in order to detect the tool from characteristic features of the signal.

When a tool is recognised, the processor produces a trigger signal which is taken to a so-called "skip" input of the computer numerical control (CNC) of the machine tool. This causes the controller to read the instantaneous values of the position encoders of the machine tool, from which is generated an offset value for use when positioning the cutting tool for cutting operations.

Such a system gives repeatable measurement results without requiring a slow feed rate for the movement of the tool into the beam, so as to provide quick operation. It also enables the rejection of extraneous signals which are not the result of the tool breaking the beam, in particular when drips of the machine tool's coolant pass through the beam.

SUMMARY

The present invention provides a tool setting or tool analysis device comprising:
- a light source for producing a light beam;
- a light receiver for receiving the light beam and producing therefrom a signal indicative of the amount of light received;
- a main analysis circuit for analysing the signal from the light receiver and generating a trigger signal when the beam is at least partially occluded;
- a secondary trigger signal generating circuit which also receives the signal from the receiver, and which generates a back up trigger signal.

We have appreciated a risk that in certain rare circumstances the main analysis circuit of the previously known devices may fail to recognise the complex signal caused by the rotating tool, and thus fail to generate a trigger signal. By providing a secondary trigger signal generating circuit, this risk is ameliorated. The secondary circuit may give lower repeatability and thus lower meteorological accuracy, compared to the main analysis circuit. However, it may provide a fail-safe signal to the machine control, to stop the movement of the tool and prevent accidental damage.

Preferably the secondary circuit generates the trigger signal if the signal from the receiver remains in a given state for longer than a predetermined time period. Preferably the output of the secondary circuit is connected in parallel with the output of the main circuit.

A further problem has been found in practical use of the prior art devices mentioned above, as follows. The skip input of some types of CNC machine tool control have a time period during which the control fails to react to a valid trigger signal. This is referred to as a blind window. During this blind window the control fails to stop the movement of the cutting tool, which can cause a crash.

In a preferred embodiment, a device according to the present invention includes an oscillator or oscillation generator, connected to provide an oscillating trigger signal. Preferably this is associated with the secondary circuit, to cause repeated trigger outputs after the end of the delay period. Should a tool break the beam within the blind window of a controller having the above problem, such repeated trigger signals will continue until after the end of the blind window and will ensure that the controller reacts.

BRIEF DESCRIPTION OF THE DRAWINGS

Preferred embodiments of the invention will now be described by way of example, with reference to the accompanying drawings, wherein.

DETAILED DESCRIPTION OF THE EMBODIMENTS

Figure 1:
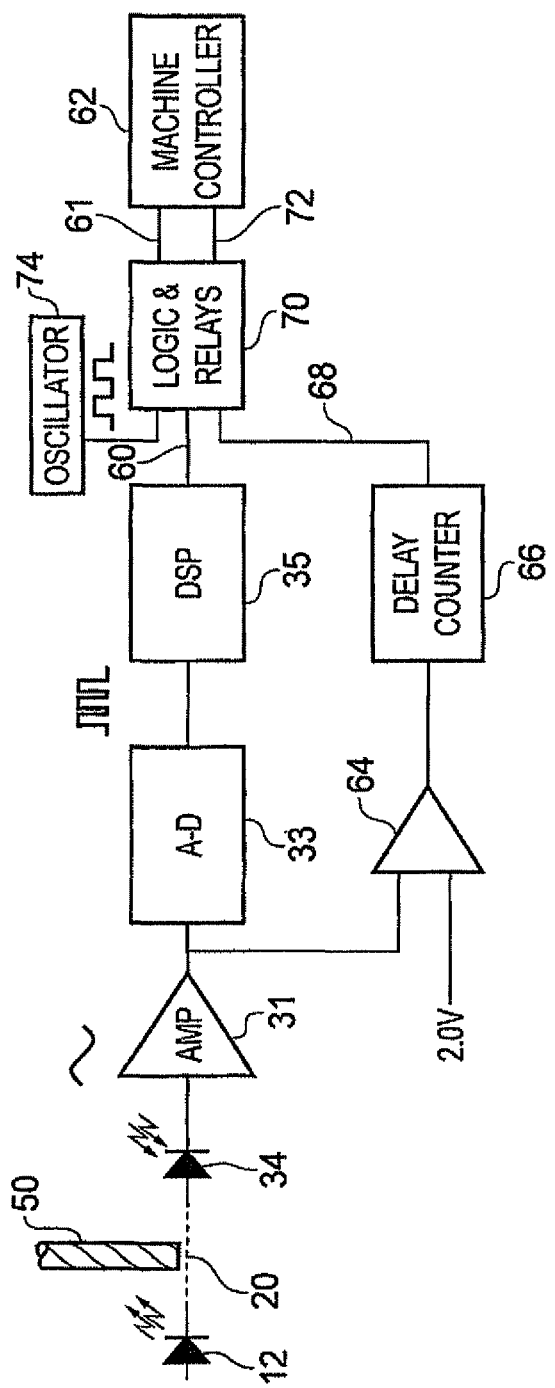
FIG. 1 is a schematic diagram of a tool analysis and setting device.

FIG. 1 shows a break beam type tool setting device. It comprises a light transmitter 12 which directs a light beam 20 towards a light receiver 34. In use the device is installed on a machine tool having a movable spindle (not shown) in which may be mounted a toothed cutting tool 50. To detect the presence of the cutting tool 50 and to perform tool setting, the spindle can move tool 50 so that it enters and at least partially obstructs the beam 20. The light transmitter 12 may be a semiconductor laser diode, and the receiver 34 may be a photodiode. Infra red light is used in this example.

The signal from the receiver 34 is amplified by an amplifier 31. In a main analysis circuit, it is then sampled by an analogue-to-digital (A-D) converter 33. The sample rate is approximately 45 kHz though other sample rates may be used.

Samples are called for by a digital signal processor (DSP) 35. This analyses the complex signal and generates a trigger output signal when it matches that of a rotating cutting tool. The trigger signal is taken to a "skip" input 61 of the CNC controller 62 of the machine tool on a line 60. On receipt of the trigger signal, the controller 62 interrogates position encoders of the machine tool, to determine the coordinate location of the spindle holding the cutting tool 50. From this, tool detection can take place and tool setting offsets may be generated.

As described so far, the device is as shown in our International Patent Application WO 2004/056528 and corresponding U.S. Pat. No. 7,315,018, to which reference should be made for further details, including the algorithm performed in the DSP 35. This ensures that the generation of the trigger signal is highly repeatable, even when the cutting tool 50 is moved into the beam 20 at a fast feed rate, so that the tool setting operation can be performed accurately and quickly. International Patent Application WO 2004/056528 and U.S. Pat. No. 7,315,018 are incorporated herein by reference.

The device further includes a secondary, redundant or backup tool detection circuit, in parallel with the A-D converter 33 and the DSP 35, and this will now be described. The purpose of this is to ensure that a trigger signal is always generated and always detected by the controller 62, even if the tool 50 is not detected by the DSP algorithm in rare circumstances, or if the machine controller fails to respond to the trigger signal from the DSP 35.

The secondary redundant or backup tool detection circuit comprises a signal comparator 64 which receives the tool signal output from the amplifier 31. The comparator 64 acts as a threshold detector, producing an output signal when the signal input passes a certain threshold. In the present example, tool signals from the amplifier are negative-going pulses, corresponding to reductions in the light throughput when the teeth of the rotating cutting tool 50 enter the light beam 20. The comparator 64 therefore generates an output when the signal from the amplifier 31 falls below a 2.0V threshold.

Figure 2:
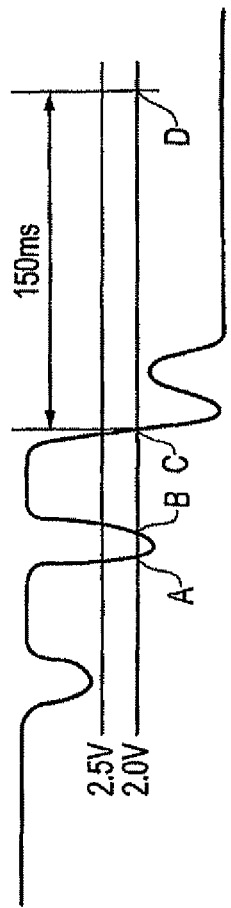
FIG. 2 shows a signal waveform in this device.

The output of the comparator 64 is taken to a delay timer 66, which counts clock pulses for a delay period of (for example) 150 ms when the threshold is passed. The timer 66 outputs a backup trigger signal on an output line 68 at the end of this delay period. Should the tool signal pass above the comparator threshold before the end of this delay period, then the timer is reset. FIG. 2 illustrates this: the timer is set at point A when the signal falls below the 2.0V threshold, but then reset at point B when it passes back above the threshold. Subsequently, the timer is set once again at point C, and this time the signal does not pass back above the threshold. The trigger signal is generated at point D, 150 ms after point C.

FIG. 2 has been simplified for the purposes of illustration. In practice, there will be many more pulses in the tool signal, as illustrated in the previous application WO2004/056528, and the timer 66 will only output its trigger signal after one of them fails to pass back above the 2.0V threshold.

Of course, if the amplifier output signal comprises positive-going pulses, then the comparator 64 would be arranged to generate its output when the tool signal exceeds the threshold, instead of when it falls below the threshold.

The output 68 of the delay timer 66 is gated with the output 60 from the DSP 35, in a circuit 70. The circuit 70 comprises driver logic and solid state relays for driving the skip input 61 of the controller 62.

The delay period of the timer 66 is chosen such that it exceeds the length of time taken for the DSP 35 to recognise a tool. The 2.0V threshold of the comparator 64 is also chosen such it is only passed after the corresponding signal threshold in the DSP 35. (I.e. the comparator threshold is lower than the DSP threshold, in the case of negative-going signals, or higher in the case of positive-going signals. In the present example, the DSP threshold may be 2.5V, as shown in FIG. 2.)

As a result, in normal operation, the DSP 35 generates its trigger output on line 60 before the secondary circuit trigger output on line 68, and this is taken to the skip input 61 of the machine controller 62. Thus, the machine controller 62 reacts to the repeatable trigger signal from the DSP 35, for accurate tool setting.

However, if the DSP 35 fails to recognise the tool, then the combination of the comparator 64 and the delay timer 66 is simple and reliable, and provides its backup trigger signal to the controller after the 150 ms delay, in a fail-safe manner. This ensures that the controller stops the movement of the tool 50 through the light beam 20, and prevents it crashing into other structure of the machine tool.

Optionally, the circuit 70 may generate a second output to the machine controller, via another solid state relay, on a line 72. This output is produced by gating together not only the outputs of the DSP 35 and the timer 66, but also an oscillator 74. As a result, after a trigger signal is generated on the line 72 from the DSP 35 or the timer 66, repeated signal edges appear on this line, caused by the oscillator. These repeated signal edges act as further trigger signals. If the machine controller 62 is in a blind window and fails to react to the first trigger signal from the DSP 35 or the timer 66, then it will react to one of these repeated further trigger signals after the end of the blind window. This provides fail-safe operation to ensure that the movement of the tool is stopped before a crash occurs.

It will be appreciated that the controller 62 may not need to be connected to both lines 61, 72. However, if the line 72 is used (because the controller suffers from a blind window), then the line 61 advantageously provides a non-oscillating input which the controller can interrogate to determine the current status of the device (triggered or not triggered).

Figure 3:
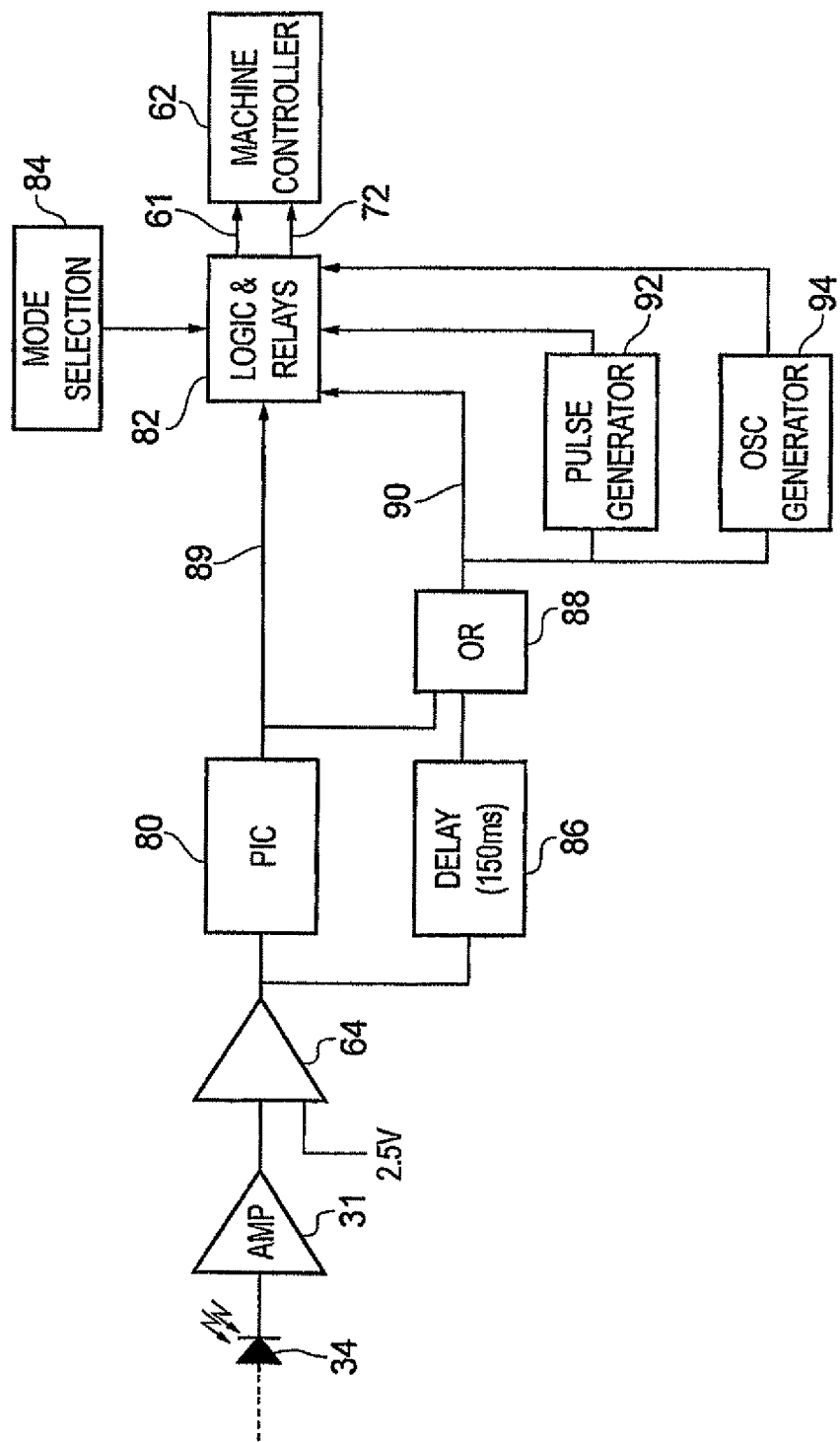
FIG. 3 is a schematic diagram of an alternative circuit for a tool analysis and setting device.

FIG. 3 shows an alternative circuit, for use with the break beam device 12, 34 of FIG. 1. Here, the main analysis circuit comprises a programmable integrated circuit (PIC) 80, rather than the DSP 35. It receives the signal from the receiver 34 via a similar amplifier 31 as in FIG. 1, and a comparator 64. This provides a pulsed input signal to the PIC, rather than an analogue-to-digital conversion. The PIC is programmed to recognise signal patterns caused by the rotating tool as it breaks the light beam.

When the PIC recognises a tool, it provides a trigger signal on a line 89 to logic circuits and solid state relays 82, and thus to the machine controller 62, as previously. This trigger signal is very repeatable, and thus provides good meteorological accuracy.

In parallel with the PIC 80, a 150 ms delay circuit 86 also receives the output of the comparator 64. This provides a fail-safe trigger signal, as with the delay counter of FIG. 1. That fail-safe signal is combined with the output of the PIC 80 in an OR-gate 88, giving a combined trigger signal on a line 90 to the logic circuits and relays 82. Thus, the combined signal on line 90 will normally provide a trigger on the output of the PIC, but if the PIC fails to recognise the tool it will trigger subsequently as a result of the output of the delay circuit.

The trigger signals on the lines 89 and 90 merely change level (from high to low or from low to high) when the tool is detected. In addition, however, a pulse generator 92 and an oscillation generator 94 are provided, receiving their inputs from the output of the OR-gate 88. The pulse generator 92 generates a combined trigger signal in the form of a pulse. The oscillation generator 94 generates a combined trigger signal in the form of a repeating square wave oscillation. Both these are taken to the logic circuits 82, from where they can be selected for passing on to the machine controller on the line 72.

The logic circuits 82 select which of the trigger signals are taken to the machine via the outputs 61 or 72, under the control of a mode selection circuit 84. The mode selection circuit may be set by a set-up switch, and/or by a so-called 'M-code' signal from the program running in the machine controller 62.

If the device is to be used in a tool-setting mode, then any of the combined trigger signals (changing-level, pulse or oscillating) may be selected by the mode selection circuit 84 and passed to the machine controller 62. Or the uncombined PIC output on line 89 may be passed to the controller. If the oscillating trigger signal is selected, then as previously its repeated signal edges act as further trigger signals, providing fail-safe operation if the controller 62 suffers from a blind window.

If the device is to be used in a non-tool-setting mode, e.g. for detecting a broken or worn tool, then the PIC output 89 is selected by the mode selection circuit 84 and passed to the machine controller 62.

The oscillation generator 94 is preferably synchronised with the combined trigger signal on the line 90 (unlike the free-running oscillator 74 in FIG. 1). This has the advantage that the oscillating trigger signal which results is generated repeatably with respect to the breaking of the light beam by the tool. It can therefore be used as a meteorologically accurate trigger signal.

It will be appreciated that other analysis circuits may be used instead of the DSP 35 or the PIC 80. Examples include a field-programmable gate array, an application specific integrated circuit, a general-purpose microprocessor or a personal computer system.

What is claimed is:

1. A tool setting or tool analysis device comprising:
a light source for producing a light beam;
a light receiver for receiving light of the light beam and producing therefrom signals indicative of the amount of light received;
a main analysis circuit configured to analyze the signals from the light receiver to determine if a pattern of the signals matches that of a rotating tool obstructing the light beam and to generate a trigger signal if the pattern of the signals matches that of a rotating tool obstructing the light beam; and
a secondary trigger signal generating circuit which also receives the signals from the receiver to determine if the signals indicate that the rotating tool is obstructing the light beam, and which generates a back up trigger signal if the main analysis circuit fails to generate said trigger signal when the tool obstructs the beam.

2. A tool setting or tool analysis device according to claim 1, wherein the secondary trigger signal generating circuit generates the back-up trigger signal if the signal from the light receiver remains in a given state for longer than a predetermined time period.

3. A tool setting or tool analysis device according to claim 1, wherein the output of the secondary trigger signal generating circuit is connected in parallel with the output of the main analysis circuit.

4. A tool setting or tool analysis device according to claim 2, wherein the output of the secondary trigger signal generating circuit is connected in parallel with the output of the main analysis circuit.

5. A tool setting or tool analysis device according to claim 2, including an oscillator or oscillation generator associated with the secondary trigger signal generating circuit, to cause repeated back-up trigger signals after the end of the predetermined time period.

6. A tool setting or tool analysis device according to claim 1, wherein the trigger signal is a change in voltage level on a line arranged to be connected with a skip input of a controller of a machine tool.

7. A tool setting or tool analysis device according to claim 1, wherein the trigger signal is a pulsed signal sent on a line arranged to be connected with a skip input of a controller of a machine tool.

8. A tool setting or tool analysis device comprising:
a light source for producing a light beam;
a light receiver for receiving light of the light beam and producing therefrom signals indicative of the amount of light received;
a main analysis circuit arranged to analyse the signals from the light receiver to determine if a pattern of the signals matches that of a rotating tool obstructing the light beam and generate a trigger signal if the pattern of the signals matches that of a rotating tool obstructing the light beam;
a secondary trigger signal generating circuit which also receives the signals from the receiver, and which generates a back up trigger signal if the main analysis circuit fails to generate said trigger signal when the tool obstructs the beam; and
an oscillator or oscillation generator, connected to provide an oscillating trigger signal.

9. A tool setting or tool analysis device comprising:
a light source for producing a light beam;
a light receiver for receiving light of the light beam and producing therefrom a signal indicative of the amount of light received;
a circuit which receives the signal from the light receiver and generates repeated trigger signals after an initial trigger signal when a tool obstructs the light beam, wherein if the initial trigger signal is generated within a blind window of a control machine, the repeated trigger signals will continue to be generated by the circuit after the blind window to ensure the control machine reacts.

10. A tool setting or tool analysis device according to claim 9, comprising an oscillator or oscillation generator for generating the repeated trigger signals.

11. A tool setting or tool analysis device according to claim 10, comprising a main analysis circuit for generating the initial trigger signal, wherein the further repeated trigger signals are produced by gating together outputs from the main analysis circuit and the oscillator or oscillation generator.

12. A tool setting or tool analysis device according to claim 8, wherein the oscillator or oscillation generator is synchronized with the initial trigger signal.

13. A tool setting or tool analysis device according to claim 10, comprising a further non-oscillating output which can be interrogated to determine if the initial trigger signal has been generated by a main analysis circuit.

14. A tool setting or tool analysis device according to claim 9, wherein the circuit generates the initial trigger signal and the repeated trigger signal upon recognising a particular signal pattern caused by the tool entering the beam.

15. A tool setting or tool analysis device according to claim 9, comprising a pulse generator for generating a pulsed trigger signal.

16. A tool setting or tool analysis device according to claim 9 comprising a mode selection circuit for selecting which one of a set of different trigger signals to output.

17. A method of generating a trigger signal for a machine controller having a movable spindle on which may be mounted a tool, a light source for producing a light beam and a light receiver for receiving light of the light beam and producing therefrom a signal indicative of the amount of light received, the method comprising:
generating an initial trigger signal and repeated trigger signals after the initial trigger signal when the tool obstructs the light beam such that, if the initial trigger signal is generated within a blind window of a control machine, the repeated trigger signals will continue after the blind window to ensure the control machine reacts.

18. A device for carrying out the method of claim 17.

19. A tool setting or tool analysis device comprising:
a light source for producing a light beam;
a light receiver for receiving light of the light beam and producing therefrom signals indicative of the amount of light received;
a circuit arranged to receive the signals from the light receiver, analyze the signals from the light receiver to determine if patterns of the signals match that of a rotating tool obstructing the light beam, and generate an initial trigger signal and repeated trigger signals after the initial trigger signal if patterns of the signals match that of a rotating tool obstructing the light beam, the initial trigger signal and the repeated trigger signals arranged to be sent to a skip input of a controller of a machine tool to cause the controller to react,
wherein the repeated trigger signals can cause the controller to react if the initial trigger signal is generated within a blind window of the controller.

20. A tool setting or tool analysis device according to claim 19, wherein each of the initial trigger signal and the repeated trigger signals comprise a signal edge.

21. A tool setting or tool analysis device according to claim 19, wherein the circuit is arranged to generate the repeated trigger signals a set time after the initial trigger signal.

22. A tool setting or tool analysis device according to claim 21, wherein the circuit comprises an oscillator or oscillation generator, the circuit generating the repeated trigger signal the set time after the initial trigger signal based upon the signals from an oscillator or oscillation generator.

23. A method of generating a trigger signal for a machine controller having a movable spindle on which may be mounted a tool, a light source for producing a light beam and a light receiver for receiving light of the light beam and producing therefrom a signal indicative of the amount of light received, the method comprising:
analyzing the signals from the light receiver to determine if patterns of the signals match that of a rotating tool obstructing the light beam, generating an initial trigger signal and repeating trigger signals after the initial trigger signal if patterns of the signals match that of a rotating tool obstructing the light beam, and sending the initial trigger signal and the repeating trigger signals to a skip input of a controller of a machine tool to cause the controller to react,
wherein the repeating trigger signals can cause the controller to react if the initial trigger signal is generated within a blind window of the controller.

24. The method according to claim 23, wherein each of the initial trigger signal and the repeating trigger signals comprise a signal edge.

25. The method according to claim 23, wherein the repeating trigger signals are generated a set time after the initial trigger signal.

* * * * *